United States Patent [19]

Ikeda et al.

[11] 4,337,115
[45] Jun. 29, 1982

[54] METHOD OF FORMING ELECTRODES ON THE SURFACE OF A SEMICONDUCTOR SUBSTRATE

[75] Inventors: Masashi Ikeda; Shintaro Ito, both of Yokohama, Japan

[73] Assignee: Tokyo Shibaura Electric Co., Ltd., Japan

[21] Appl. No.: 137,813

[22] Filed: Apr. 4, 1980

Related U.S. Application Data

[60] Division of Ser. No. 959,219, Nov. 9, 1978, abandoned, which is a continuation-in-part of Ser. No. 802,867, Jun. 2, 1977, abandoned.

[30] Foreign Application Priority Data

Jun. 2, 1976 [JP] Japan ............................ 51-63561

[51] Int. Cl.$^3$ .................. H01L 21/306; C23F 1/02; B05D 5/12
[52] U.S. Cl. ............................ 156/659.1; 29/580; 29/591; 156/653; 156/657; 156/643; 357/54; 357/65; 427/88
[58] Field of Search .................. 156/653, 657, 659.1, 156/643, 646; 252/79.3; 427/88-91; 29/580, 591; 357/65, 68, 69, 54; 430/311, 313, 314, 316, 317; 204/192 E, 298

[56] References Cited

U.S. PATENT DOCUMENTS

| | | | |
|---|---|---|---|
| 3,784,424 | 1/1974 | Chang | 156/656 X |
| 3,842,490 | 10/1974 | Seales | 29/578 |
| 3,951,708 | 4/1976 | Dean | 427/89 X |
| 4,078,963 | 3/1978 | Symersky | 156/652 |

*Primary Examiner*—William A. Powell
*Attorney, Agent, or Firm*—Finnegan, Henderson, Farabow, Garrett & Dunner

[57] ABSTRACT

There is provided a method of forming an electrode on the surface of a semiconductor substrate which comprises the steps of
(A) depositing on the surface of a semiconductor substrate an insulation layer provided with at least one opening for contact between the electrode and the semiconductor substrate;
(B) coating a plurality of spacer layers made of insulation material on the surface of the insulation layer inclusive of the contact opening;
(C) selectively depositing a photoresist layer on the uppermost are of said plural spacer layers, said uppermost spacer layer in direct contact with the photoresist layer being designed to be etched at a lower rate than the immediately underlying spacer layer;
(D) using the photoresist layers as a mask to selectively etch the spacer layers until said opening is exposed;
(E) depositing a metal layer on the surface of the semiconductor substrate inclusive of said opening and photoresist layer; and
(F) removing the photoresist layer and the portions of the metal layer formed, such that the portion of the metal layer which is deposited on the surface of the semiconductor substrate exposed through the opening constitute the electrode, and the spacer layers remaining on the insulation layer form protective layers for the surface of the semiconductor substrate.

8 Claims, 7 Drawing Figures

METHOD OF FORMING ELECTRODES ON THE SURFACE OF A SEMICONDUCTOR SUBSTRATE

CROSS-REFERENCE TO RELATED APPLICATION

This is a division of application Ser. No. 959,219, filed Nov. 9, 1978, now abandoned, which is a continuation-in-part application of Ser. No. 802,867 filed June 2, 1977, now abandoned and assigned to the same assignee as the present invention.

BACKGROUND OF THE INVENTION

This invention relates to a method of forming electrodes on the surface of a semiconductor substrate, and more particularly to a method of mounting electrodes on the surface of a semiconductor substrate, while extremely reducing the width of the electrodes and the interelectrode distance with high precision, as well as to a semiconductor device manufactured by said method.

The known process of effecting the above-mentioned manufacture is set forth in the U.S. Pat. No. 3,822,467 filed Apr. 25, 1973. A method proposed in the United States Patent to manufacture a semiconductor device having a conductor pattern comprises the following steps:

(A) forming a semiconductor body whose surface is covered with a perforated insulation layer and which includes a semiconductor zone accessible through the aperture;

(B) mounting on the surface of the insulation layer an auxiliary layer which is formed of a metal essentially different from that of the conductor pattern and is provided with at least one recess having a predetermined outline corresponding to that of the pattern of conductors which are subsequently deposited;

(C) depositing on the semiconductor body a layer of electrically conductive material, whose first portion is spread over the auxiliary layer and whose second portion is disposed in the recess, extends over the insulation layer and is connected to the semiconductor zone; and (D) removing the auxiliary layer and the first portion of the conductive layer while retaining on the semiconductor body the second portion of the conductive layer which bears the conductor pattern.

The above mentioned step (C) is undertaken by vapor deposition or sputtering. The concrete process runs as follows. The step (C) is to provide a conductive layer by gas phase growth and at reduced pressure, utilize a local source of material, transport the material of the conductive layer mainly in a direction perpendicular to the surface of the semiconductor body.

Where the material of the conductive layer is deposited in a direction inclined to the surface of the semiconductor body, instead of in a direction perpendicular there to, then the material of the conductive layer is also deposited on the lateral wall of the auxiliary layer, undesirably giving rise to a contact between the auxiliary layer and the second portion of the conductive layer, and presenting difficulties in the satisfactory performance of the step (D).

Where the material of the conductive layer is deposited perpendicularly on the surface of the semiconductor body as described in the aforesaid U.S. Patent, then a conductive layer formed on the upper portion or stepped portion of the aperture drilled in the insulation layer will have a far smaller thickness than the other portions of said conductive layer, namely, those mounted on the insulation layer and that portion of the semiconductor body which is exposed through the aperture. Therefore the conductive layer is likely to be broken at such then portion.

In the step (D), it is necessary to fully remove the auxiliary metal layer from the surface of the insulation layer. If any amount of the auxiliary metal layer is retained on the surface of the insulation layer, a contact arises between the residual auxiliary metal layer and conductor pattern, possibly resulting in interelectrode short-circuiting. Moreover, the insulation layer underlying the residual auxiliary metal layer acts as a dielectric element, leading to the occurrence of stray capacitance. This stray capacitance is most objectionable to a circuit portionlarly required to have high frequency characteristics.

SUMMARY OF THE INVENTION

It is accordingly an object of the invention to provide a method of forming electrodes on the surface of a semiconductor substrate, while extremely reducing the width of the electrodes and interelectrode distance with high precision, and a semiconductor device manufactured by said method.

Another object of the invention is to provide a method of manufacturing a semiconductor device in which a metal electrode layer does not tend to be broken at the stepped portion of an electrode contact hole.

Another object of the invention is to provide a method of manufacturing a semiconductor device in which stray capacitance is little likely to occur.

Still another object of the invention is to provide a method of manufacturing a semiconductor device which can form a fine conductor pattern and provide a strong protective insulation layer around said fine conductor pattern.

According to an aspect of this invention, there is provided a method of forming an electrode on the surface of a semiconductor substrate which comprises the steps of (A) depositing on the surface of a semiconductor substrate an insulation layer provided with at least one opening for contact between the electrode and the semiconductor substrate;

(B) coating a plurality of spacer layers made of insulation material on the surface of the insulation layer inclusive of the contact opening;

(C) selectively depositing a photoresist layer on the uppermost one of said plural spacer layers, said uppermost spacer layer in direct contact with the photoresist layer being designed to be etched at a lower rate than the immediately underlying spacer layer;

(D) using the photoresist layers as a mask to selectively etch the spacer layers until said opening is exposed;

(E) depositing a metal layer on the surface of the semiconductor substrate inclusive of said opening and photoresist layer; and (F) removing the photoresist layer and the portions of the metal layer formed thereof, such that the portion of the metal layer which is deposited on the surface of the semiconductor substrate exposed through the opening constitute the electrode, and the spacer layers remaining on the insulation layer form protective layers for the surface of the semiconductor substrate.

The spacer layers used in this invention are selected from the group consisting of doped and undoped silicon oxide layers, an undoped polycrystalline layer and a silicon nitride layer. The doped or undoped silicon oxide layer should preferably be provided by chemical vapor deposition or application of a solution of silicon oxide powder, followed by drying.

The above-mentioned step (E) of the method of this invention is carried out preferably by vapor deposition or sputtering. The particles of the material of the metal layer are deposited on the surface of the semiconductor substrate by being scattered in a direction inclined to said surface instead of in a direction perpendicular thereto.

DESCRIPTION OF THE PREFERRED EMBODIMENTS

Figure 1:
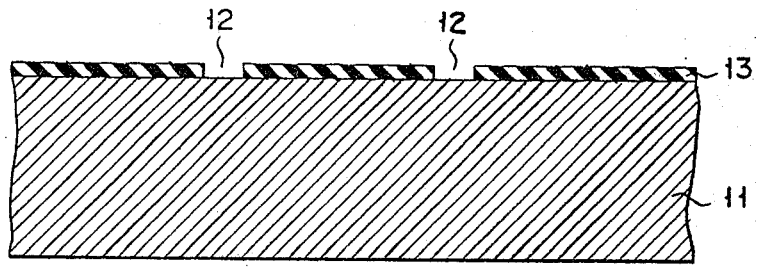
FIGS. 1 to 5 are sectional views of a semiconductor device corresponding to the sequential steps of a method of manufacturing the same according to one embodiment of this invention.
Figure 2:
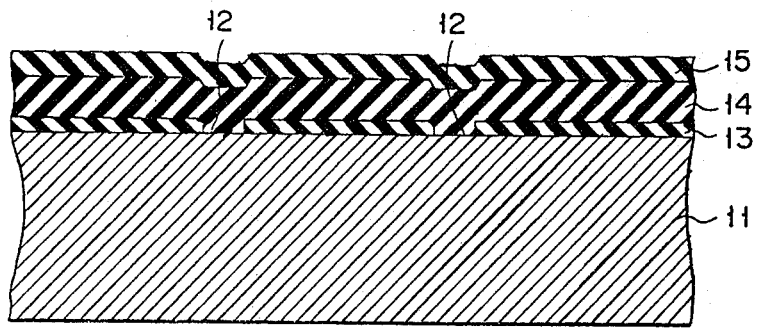

The preferred embodiments of this invention will now be described by reference to the drawing. FIG. 1 shows a silicon substrate 11. The substrate is coated with an insulation film 13 except for two contact holes 12. The silicon oxide insulation film 13 is formed by thermally oxidizing the surface of the silicon substrate 11. Some regions (not shown) of a prescribed conductivity type are formed in the silicon substrate 11 to provide circuit elements such as transistors and resistors. A spacer layer 14 is deposited on the surface of the silicon substrate 11 inclusive of the contact holes 12 and the insulation layer 13. Another spacer layer 15 is mounted on said spacer layer 14. The spacer layer 14 is provided by the chemical vapor deposition of a silicon oxide film doped with an impurity of phosphorus at a concentration of about $2 \times 10^{21}/cm^3$. The spacer layer 15 is mounted by the chemical vapor deposition of an undoped silicon oxide film, and is designed to be etched at a smaller rate than the spacer layer 14. In other words, where the same type of etchant is used, the spacer layer 15 is etched at a rate smaller than one-fifth of that at which the spacer layer 14 is etched. It is preferred that the upper spacer layer 15 be very adhesive to a photoresist layer 16 which will later be deposited thereon. The lower spacer layer 14 is preferred to have a greater thickness than the upper spacer layer 15.

Figure 3:
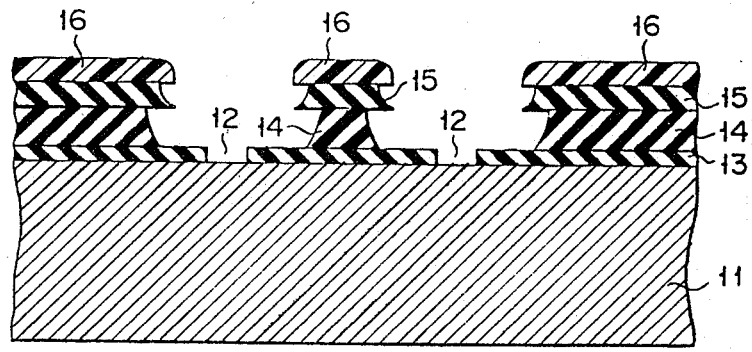
Figure 4:
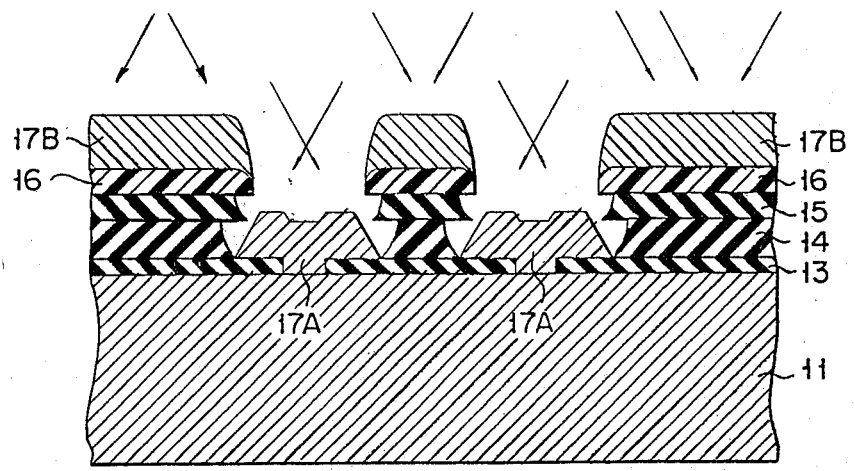
Figure 5:
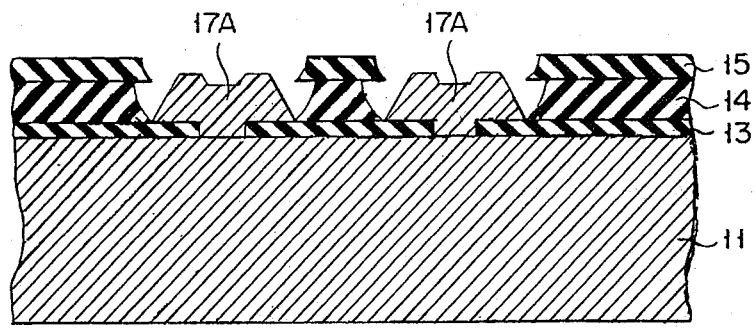

The ratio of the thickness of the upper spacer layer 15 to that of the lower spacer layer 14 is chosen to fall within the range of 1:1 to 1:3. Further, the thickness of the upper spacer layer 15 is preferred to be not less than 1 micron. The photoresist layers 16 are selectively formed on the spacer layer 15 (FIG. 3). A solution of ammonium fluoride is applied to etch the spacer layers 14, 15 until the contact holes 12 are exposed. In this case, the spacer layers 14, 15 are etched in both vertical and lateral directions. However, the upper spacer layer 15 which is etched more slowly than the lower spacer layer 14 retains a sufficiently large contact area to adhere well to the photoresist 16, thereby preventing the photoresist layer 16 from undesirably peeling off prior to the "lift-off" process. As shown in FIG. 4 a metal layer 17 A of aluminium, titanium or platinum is formed by vapor deposition or sputtering on those portions of the surface of the silicon substrate 11 which are exposed through the contact holes 12, and those portions of the insulation film 13 which are formed around the contact holes 12 and a metal layer 17 B of the similar metal is simultaneously formed on the photoresist layer 16. Where, in this case, the silicon substrate 11 is rotated on its own axis and also made to revolve around, then metal particles scattered on the surface of the laminated mass from above in vacuum are not deposited on said surface in a vertical direction, but at a certain angle to said surface as indicated by the arrows of FIG. 4. As a result, metal particles also settle on the edge portions of the contact holes 12 in a sufficient amount to prevent the metal layer 17 A from being broken at the stepped edge portion of the contact holes 12. Last, application of an etchant dissolves the photoresist 16 with the resultant removal of the metal layer 17 B mounted thereon. Thus, as shown in FIG. 5, a semiconductor device is provided, which comprises the silicon substrate 11; the metal layer 17 A extending over those portions of the insulation layer 13 which are formed around the contact holes 12 in contact with those portions of the silicon substrate 11 which are exposed through the contact holes 12; and the spacer layers 14, 15 mounted on the insulation layer 13 so as to surround the metal layer 17 A. The spacer layers 14, 15 prevent undesirable impurities from being carried into a circuit element such as a transistor which is provided in the silicon substrate 11 and also act as protective layers to increase the mechanical strength of the surface of the silicon substrate 11. Accordingly, the appearance of pin holes in the insulation layer and the occurrence of undesirable shortage in the dielectric strength of a field oxide film are suppressed, thereby improving the reliability of a semiconductor device.

Figure 6:
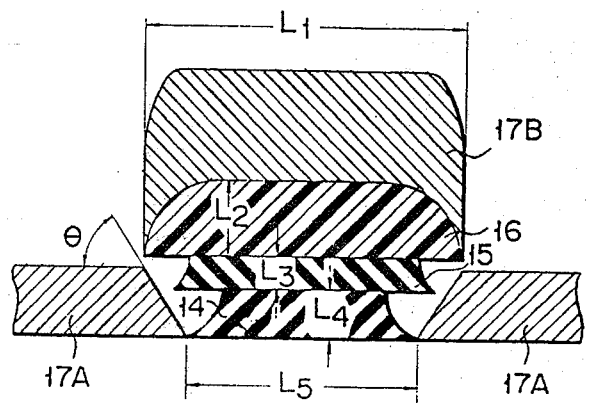
FIG. 6 is a fractional enlarged view of FIG. 4.

FIG. 6 is an enlarged sectional view of the central portion of FIG. 4 after evaporation of metal layers 17 A and 17 B. During said evaporation the particles of the metal are deposited on the surface of the silicon substrate 11 in a direction inclined to said surface through an angle of, for example, 60°, instead of in a direction perpendicular thereto and also settle on the edge portions of the contact holes 12.

Referring to FIG. 6, the reference numeral 17 A denotes a metal layer mounted on the insulation layer 13. The reference numeral 17 B shows a metal layer formed on the photoresist layers 16. This metal layer 17 B is later removed with the photoresist layer 16. Each photoresist layer 16 has a length $L_1$ of 3 microns and a thickness $L_2$ of 1 micron. The upper spacer layer 15 has a thickness $L_3$ of 0.3 micron, and the lower spacer layer 14 has a thickness $L_4$ of 0.4 micron. $L_5$ shows a distance between the electrodes constituted by the metal layer 17 A. The interelectrode distance $L_5$ can be reduced to about 2 microns in accordance with this invention, when the metal layers 17 A and 17 B are evaporated on the surface of the silicon substrate 11 by causing the particles of the metal to settle on said surface in a direction not perpendicular thereto but inclined thereto through an angle $\ominus$ of for example, 60°. Therefore, this invention enables a semiconductor device to be integrated with a higher density than has been possible in the past.

In the foregoing embodiment, the spacer layers 14, 15 are etched by an etchant of for example, ammonium fluoride solution. However, the removal of the spacer layers 14, 15 may be effected not only by chemical etching, but also by plasma or by a combination of both etching processes. In accordance with another embodiment of this invention, the lower spacer layer 14 of FIG. 3 is formed of a doped or undoped silicon oxide film mounted by chemical vapor deposition, while the upper spacer layer 15 consists of an undoped film of polycrystalline silicon or silicon nitride formed similarly by chemical vapor deposition. Since the lower spacer layer 14 formed of a silicon oxide film is etched very slowly, the upper spacer layer 15 made of a film of undoped polycrystalline silicon or silicon nitride can be preferentially etched by plasma with the photoresist layer 16 used as a mask. Thereafter the lower spacer layer 14 is selectively etched by an etchant of ammonium fluoride with the photoresist layer 16 and the upper spacer layer 15 remaining on the lower spacer layer 14 used as masks. At this time, a semiconductor device of FIG. 3 is obtained.

In accordance with still another embodiment, the lower spacer layer 14 is formed of an undoped film of polycrystalline silicon, while the upper spacer layer 15 is made of a film of silicon nitride. The lower and upper spacer layers 14, 15 are selectively etched by plasma with the photoresist layers 16 used as masks. Since the lower spacer layer 14 is etched at a much larger rate than the upper spacer layer 15, a semiconductor device of FIG. 3 results.

Figure 7:
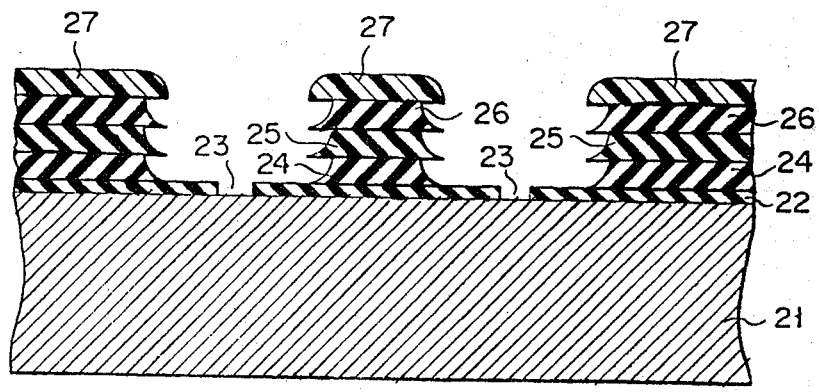
FIG. 7 shows the section of a semiconductor device manufactured by a method according to another embodiment of this invention.

FIG. 7 illustrates another type of semiconductor device comprising three spacer layers. FIG. 7 shows a silicon substrate 21 whose surface is thermally oxidized to provide an insulation layer 22. Two contact holes 23 are formed in said insulation layer 22 of silicon oxide by selective etching. The lowermost spacer layer 24 is prepared by chemical vapor deposition of a silicon oxide film doped with phosphorus. The intermediate spacer 25 is deposited by chemical vapor deposition of an undoped film of silicon oxide. The uppermost spacer layer 26 is formed by chemical vapor deposition of an undoped film of polycrystalline silicon. Thereafter, photoresist layers 27 are selectively deposited on the surface of the uppermost spacer layer 26. First, the uppermost spacer layer 26 alone is selectively etched by plasma with the photoresist layer 27 used as a mask. Thereafter, the intermediate spacer layer 25 and lowermost spacer layer 24 are selectively etched by an etchant of ammonium fluoride with the remaining uppermost spacer layer 26 and photoresist layer 27 used as masks. The subsequent steps of depositing a metal layer and performing the "lift-off" process may be taken in the same manner as in the above-mentioned embodiment.

What we claim is:

1. A method of forming an electrode on the surface of a semiconductor substrate which comprises the steps of:
   (A) depositing on the surface of a semiconductor substrate an insulation layer provided with at least one opening for contact between the electrode and the semiconductor substrate;
   (B) coating a plurality of spacer layers made of insulation material on the surface of the insulation layer inclusive of the contact opening;
   (C) selectively depositing a photoresist layer on the uppermost one of said plural spacer layers, said uppermost spacer layer in direct contact with the photoresist layers being designed to be etched at a lower rate than the immediately underlying spacer layer;
   (D) using the photoresist layer as a mask to selectively etch the spacer layers until the opening of the insulation layer is exposed;
   (E) depositing a metal layer on the surface of the semiconductor substrate through the opening of the insulation layer and on the surface of the photoresist layer; and
   (F) removing the photoresist layer and the portions of the metal layer formed thereon, such that that portion of the metal layer which is deposited on the surface of the semiconductor substrate exposed through the contact opening constitutes the electrode and the spacer layers remaining on the insulation layer form protective layers for the surface of the semiconductor substrate.

2. The method according to claim 1, wherein the plural spacer layers are selected from the group consisting of doped and undoped silicon oxide layers, an undoped polycrystalline silicon layer and a silicon nitride layer.

3. The method according to claim 1, wherein the step of (E) is carried out by vapor deposition or sputtering; and the particles of the material of the metal layer are deposited on the surface of the silicon substrate by being scattered in a direction inclined to said surface, instead of in a direction perpendicular thereto.

4. The method according to claim 1, wherein the plural spacer layers are formed of an upper layer contacting the photoresist layers and a lower layer formed on the underside of said upper layer.

5. The method according to claim 4, wherein the lower spacer layer is a silicon oxide film doped with phosphorus, and the upper spacer layer is an undoped film of silicon oxide, and which includes the step of etching the upper and lower spacer layers by a solution of ammonium fluoride.

6. The method according to claim 5, wherein the ratio of the thickness of the upper spacer layer to that of the lower spacer layer falls within the range of about 1:1 to 1:3.

7. The method according to claim 6, wherein the upper spacer layer has a thickness of not less than 1 micron.

8. The method of claim 1 wherein said metal layer is further deposited on those portions of the surface of said insulation layer which are at the edge of said contact opening.

* * * * *